(12) United States Patent
Oyu et al.

(10) Patent No.: US 9,748,215 B2
(45) Date of Patent: Aug. 29, 2017

(54) LIGHT EMITTING DEVICE

(71) Applicant: NICHIA CORPORATION, Anan-shi, Tokushima (JP)

(72) Inventors: Takahiro Oyu, Tokyo (JP); Masato Ono, Sagamihara (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 14/974,387

(22) Filed: Dec. 18, 2015

(65) Prior Publication Data

US 2016/0190111 A1   Jun. 30, 2016

(30) Foreign Application Priority Data

Dec. 29, 2014   (JP) ................................. 2014-266959

(51) Int. Cl.
| | | |
|---|---|---|
| H01L 25/00 | (2006.01) | |
| H01L 25/16 | (2006.01) | |
| H01L 25/075 | (2006.01) | |
| H01L 23/00 | (2006.01) | |
| H01L 33/48 | (2010.01) | |

(52) U.S. Cl.
CPC ............ H01L 25/167 (2013.01); H01L 24/97 (2013.01); H01L 25/0753 (2013.01); *H01L 33/483* (2013.01); *H01L 2924/0002* (2013.01)

(58) Field of Classification Search
CPC ... H01L 25/167; H01L 24/97; H01L 25/0753; H01L 2924/0002; H01L 33/483; H01S 5/02248; H01S 5/4087; H01S 5/02208
USPC ............... 250/504 R, 453.11–455.11
See application file for complete search history.

(56) References Cited

U.S. PATENT DOCUMENTS

| | | | | |
|---|---|---|---|---|
| 6,501,084 | B1 * | 12/2002 | Sakai ..................... | F21K 9/00 250/504 R |
| 2011/0180817 | A1 * | 7/2011 | Ishizaki .................. | F21V 3/00 257/88 |
| 2013/0049564 | A1 * | 2/2013 | Jung ...................... | H01S 5/02469 313/45 |
| 2013/0257266 | A1 * | 10/2013 | Ishizaki ................. | H01L 33/504 313/503 |
| 2014/0367718 | A1 * | 12/2014 | Park ...................... | H01L 33/486 257/98 |

FOREIGN PATENT DOCUMENTS

| | | |
|---|---|---|
| JP | 2013-026605 A | 2/2013 |
| JP | 2013-244727 A | 12/2013 |
| JP | 2014-011195 A | 1/2014 |
| JP | 2014-090055 A | 5/2014 |

\* cited by examiner

*Primary Examiner* — Michael Maskell
(74) *Attorney, Agent, or Firm* — Global IP Counselors, LLP

(57) ABSTRACT

A light emitting device includes: at least one first light emitting element configured to emit ultraviolet light; at least one second light emitting element configured to emit light with a wavelength longer than that of the ultraviolet light emitted from the at least one first light emitting element; an electronic component including a resin portion on a surface thereof; and a substrate on which the at least one first light emitting element, the at least one second light emitting element, and the electronic component are mounted and disposed in that order along a first direction of the substrate.

7 Claims, 8 Drawing Sheets

LIGHT EMITTING DEVICE

CROSS-REFERENCE TO RELATED APPLICATIONS

This application claims priority to Japanese Patent Application No. 2014-266959 filed on Dec. 29, 2014. The entire disclosure of Japanese Patent Application No. 2014-266959 is hereby incorporated herein by reference.

BACKGROUND

1. Technical Field

The present disclosure relates to a light emitting device including a light emitting element that emits ultraviolet light.

2. Description of Related Art

Light emitting devices in which a light emitting diode, a laser diode, or another such light emitting element is provided on a substrate have been proposed. Depending on the application, a light emitting device such as this may comprise a light emitting element that emits ultraviolet light. Also, in order to ensure the required characteristics in the light emitting device, in addition to the light emitting element, sometimes a Zener diode, connector, or various other such electronic components are installed on the substrate of the light emitting device.

Such a light emitting device is utilized as a light irradiation device, such as in the curing of UV-setting resins and other such organic material. Because these devices are used in the curing of UV-setting resins, in which curing may be inadequate due to oxygen inhibition, a light irradiation device has been proposed in which a first light emitting element group is provided, and there is also a second light emitting element group that emits light of a shorter wavelength than the wavelength of the light emitted by the light emitting elements in this first light emitting element group (JP2013-244727A).

However, in the case where ultraviolet light is absorbed by the members included in the light emitting device, it may degrade the members themselves or decompose the material of which they are made, and there may be the risk that the foreign matter originating in this degradation and decomposition will come loose within the device in which the light emitting device is mounted.

SUMMARY

A light emitting device of the present disclosure includes: at least one first light emitting element configured to emit ultraviolet light; at least one second light emitting element configured to emit light with a wavelength longer than that of the first light emitting element; an electronic component including a resin portion on a surface thereof; and a substrate on which the at least one first light emitting element, the at least one second light emitting element, and the electronic component are mounted and disposed in that order along a first direction of the substrate.

Another light emitting device of the present disclosure includes: at least one first light emitting element configured to emit ultraviolet light; at least one second light emitting element whose light distribution is narrower than that of the at least one first light emitting element; an electronic component including a resin portion on a surface thereof; and a substrate on which the at least one first light emitting element, the at least one second light emitting element, and the electronic component are mounted and disposed in that order along a first direction of the substrate.

Disclosed herein is a light emitting device equipped with a light emitting element that emits ultraviolet light, wherein it is possible to provide a light emitting device with which the risk that the members in the light emitting device will be degraded or their material decomposed can be reduced, and high quality and long-term reliability can be ensured.

DETAILED DESCRIPTION OF THE EMBODIMENTS

Figure 1A:
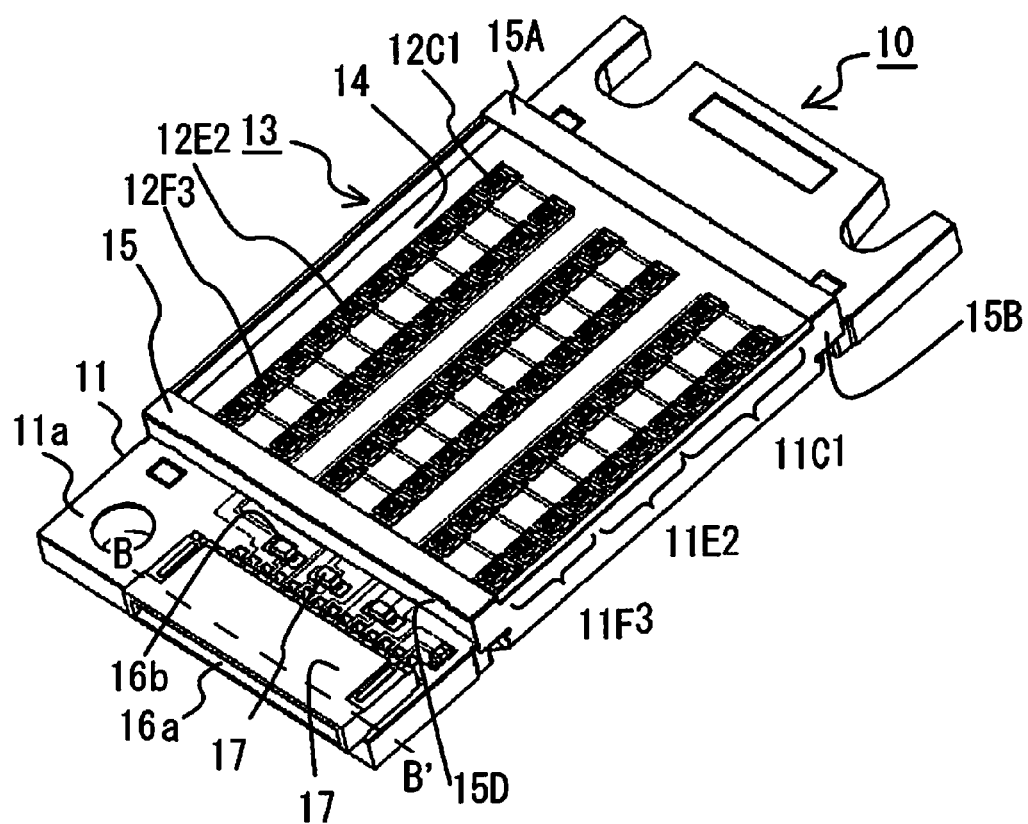
FIG. 1A is a schematic oblique view of an embodiment of the light emitting device disclosed herein.

Embodiments for implementing the light emitting device of the present disclosure will be described below with reference to the accompanying drawings. In the following embodiment of the light emitting device that embody the technological concept of the present disclosure are just examples, and unless otherwise specified, the constituent parts discussed in the embodiments are not intended to limit the scope of the present disclosure. Further, constitutions described in examples and the embodiments can be employed in other examples and embodiments.

The sizes and the arrangement relationships of the members in each of drawings are occasionally shown exaggerated for ease of explanation.

The light emitting device in an embodiment of the present disclosure includes at least a first light emitting element that emits ultraviolet light, a second light emitting element that emits light with a wavelength longer than that of the first light emitting element, an electronic component including a resin portion on their surface, and a substrate on which the first light emitting element, the second light emitting element, and the electronic component are mounted. In the light emitting device, the first light emitting element, the second light emitting element, and the electronic component are disposed in that order along a first direction of the substrate.

The light emitting device in another embodiment includes at least a substrate, a first light emitting element that emits ultraviolet light, a second light emitting element whose light distribution is narrower than that of the first light emitting element, an electronic component including a resin portion on their surface, and a substrate on which the first light emitting element, the second light emitting element, and the electronic components are mounted. In the light emitting device, the first light emitting element, the second light emitting element, and the electronic component are disposed in that order along a first direction of the substrate.

The light emitting device in an embodiment of the present disclosure preferably further include a cap. With this light emitting device, at least a light emitting element that emits ultraviolet light and an electronic component are mounted on a substrate, and light emitted from the light emitting element is extracted through the cap.

Light Emitting Element

The light emitting device in an embodiment of the present disclosure includes at least two different kinds of light emitting element. In the present specification, different kinds of light emitting element means that the emission wavelengths or the light distributions of the light emitting elements are different. More specifically, there are provided a light emitting element that emits ultraviolet light, and a light emitting element of a different kind from that of this light emitting element, for example. In the present specification, "ultraviolet light" refers to light with a wavelength of 185 to 400 nm.

The light emitting device in an embodiment includes a first light emitting element that emits ultraviolet light, and a second light emitting element that emits light whose wavelength is longer than that of the first light emitting element.

The light emitting device in another embodiment includes a third light emitting element that emits ultraviolet light, and a fourth light emitting element whose light distribution is narrower than that of the third light emitting element.

The second light emitting element and the fourth light emitting element may emit ultraviolet light, or may emit light whose wavelength is longer than that of ultraviolet light. More specifically, they may emit light with a wavelength of at least 405 nm and no more than 425 nm.

The light emitting element can be any light emitting diode, laser, or other such light emitting element that is commonly used in this field. For instance, a variety of semiconductors can be used, such as a nitride semiconductor ($In_XAl_YGa_{1-X-Y}N$; $0 \leq X$, $0 \leq Y$, $X+Y \leq 1$), GaP, GaAs, or another such Group III-V compound semiconductor, ZnSe, a Group II-VI compound semiconductor, or the like. The emission wavelength of the light emitting element can be varied as desired by varying the material or composition of the light emitting layer (active layer) of the semiconductor layer.

The light emitting element may have an element substrate that is light-transmissive, such as sapphire. This light emitting element can have relatively broad light distribution in order for the light to be emitted from the side faces of a light-transmissive substrate that is thicker than the semiconductor layer.

The semiconductor layer of the light emitting element may formed on a growth substrate, and the growth substrate may be removed from the semiconductor layer by laser liftoff or another such method. In the case where the light emitting element has the semiconductor layer from which the growth substrate has been removed, there will be no layer that does not contribute directly to emission, so the absorption of light emitted from the emission light, which would otherwise be caused by such layer that does not contribute directly to emission, can be reduced. Also, in the case where the growth substrate of the light emitting element is light-transmissive, the light distribution will be narrower than that of a light emitting element having the above-mentioned light-transmissive substrate by removing the growth substrate from the semiconductor layer.

Furthermore, the light emitting element may include a semiconductor layer provided on the side of the light emitting element where the light is extracted, an element substrate that serves as the mounting face for the light emitting element, and a reflective film provided between the semiconductor layer and the element substrate. Such light emitting element can be emitted light above the light emitting element due to reflection by a reflective film which is disposed close to the semiconductor layer, so the light distribution may narrower than with a light emitting element having a light-transmissive substrate. There may also be a semiconductor layer provided on the side of the light emitting element where the light is extracted, and an element substrate with low light-transmissive material that serves as the mounting face for the light emitting element. Such a light emitting element also tends to emit light above the light emitting element, and therefore has a light distribution that is narrower than with a light emitting element having a light-transmissive substrate.

Examples of the material of an element substrate with low light-transmissive property include metals such as CuW and tungsten, as well as silicon, germanium, SiC, and so forth.

The light emitting element has at least, a negative and a positive, a pair of electrodes. The electrodes may be disposed on the opposite side or the same side of semiconductor layer.

The light emitting element may be any mounting manner such as flip-chip mount mounted on the substrate, or face-up mount, i.e., mounting in which the bottom surface of the light emitting element is bonded to the substrate and an electrical connection made with at least a wire, etc. In the case where the light emitting element and the electrode on the substrate are connected by a wire, a cap can be used to protect the wire.

In an embodiment, the light emitting device includes a first light emitting element that emits ultraviolet light, and also comprises a second light emitting element that emits light whose wavelength is longer than that of the first light emitting element.

The wavelength of the light emitting elements can be suitably selected, examples include 255, 280, 310, 365, 375, 385, 395, 400, 405, 415, 420, and 425 nm. There may be at least two different kinds of light emitting element provided to a single light emitting device, but there may be three kinds, or four or more kinds. For example, (i) a combination of light emitting elements which emit lights of 225 nm, 310 nm, 365 nm, 385 nm and 405 nm;
(ii) a combination of a light emitting element which emits light of 225 nm and a light emitting element which emits light of 365 nm;
(iii) a combination of a light emitting element which emits light of 365 nm, a light emitting element which emits light of 385 nm and a light emitting element which emits light of 405 nm;
(iv) a combination of a light emitting element which emits light of 365 nm, a light emitting element which emits light of 395 nm and a light emitting element which emits light of 405 nm;
(v) a combination of a light emitting element which emits light of 255 nm, a light emitting element which emits light of 310 nm and a light emitting element which emits light of 365 nm; and
(vi) a combination of a light emitting element which emits light of 365 nm, a light emitting element which emits light of 385 nm and a light emitting element which emits light of 395 nm.

In the case where a light emitting element that emits light of 310 nm, a light emitting element that emits light of 365 nm, and a light emitting element that emits light of 405 nm are used, a light emitting device can be obtained whose wavelength approximates that of an H bulb type of high-pressure mercury vapor lamp.

In the case where light emitting elements which emit lights of 225 nm, 310 nm, 365 nm, 400 nm and 420 nm are used, a light emitting device can be obtained whose wavelength further approximates that of an H bulb type of high-pressure mercury vapor lamp.

In the case where a light emitting element that emits light of 310 nm, a light emitting element that emits light of 385 nm, and a light emitting element that emits light of 405 nm are used, a light emitting device can be obtained whose wavelength approximates that of a D bulb type of high-pressure mercury vapor lamp.

In the case where light emitting elements which emit lights of 365 nm, 385 nm, 395 nm and 405 nm are used, a light emitting device can be obtained whose wavelength further approximates that of a D bulb type of high-pressure mercury vapor lamp.

In the case where light emitting elements which emit lights of 365 nm, 405 nm, 415 nm, 420 nm and 425 nm are used, a light emitting device can be obtained whose wavelength further approximates that of a V bulb type of high-pressure mercury vapor lamp.

In the case where light emitting elements that emit light of 280 nm, 310 nm, 365 nm, 385 nm, 405 nm, and 420 nm are used, a light emitting device can be obtained whose wavelength approximates that of an ozone-less type of metal halide lamp.

In the case where light emitting elements that emit light of 255 nm, 280 nm, 310 nm, 365 nm, 385 nm, 405 nm, and 420 nm are used, a light emitting device can be obtained whose wavelength further approximates that of an ozone-less type of metal halide lamp.

A light emitting device that emits light whose wavelength approximates that of an existing high-pressure mercury vapor lamp and/or metal halide lamp can be obtained by thus combining the emission wavelengths of the light emitting elements. Also, a combination that used relatively short wavelengths can be effectively utilized in applications involving sterilization and the curing of resins and the like.

In another embodiment of the present disclosure, the light emitting device comprises a third light emitting element and a fourth light emitting element that are of mutually different kinds. The third light emitting element emits ultraviolet light, while the fourth light emitting element has a light distribution that is narrower than that of the third light emitting element, as discussed above.

The third light emitting element and the fourth light emitting element may have different emission wavelengths, or they may be the same. The emission wavelength can be suitably selected, and the above-mentioned combinations of different wavelengths can be used.

The third light emitting element may emit light whose wavelength is longer or shorter than that of the fourth light emitting element, but preferably it emits light whose wavelength is longer than that of the fourth light emitting element, and a light emitting element that emits light in the visible band is preferable.

As to the combination of wavelengths, in the case where the third light emitting element emits light whose wavelength is longer than that of the fourth light emitting element and emits ultraviolet light, an m-th light emitting element ($m \geq 6$) being a light emitting element that emits light whose wavelength is longer than that of the third light emitting element and emits light whose wavelength is longer than that of ultraviolet light, and an m+1-th light emitting element being a light emitting element that emits light whose wavelength is different from those of these others, then the combination of emission wavelengths for the fourth light emitting element, the third light emitting element, the optional m-th light emitting element, and the m+1-th light emitting element can be selected from among the above-mentioned light emitting element wavelengths.

The light emitting element may be mounted on the substrate by using a bonding member. Examples of the bonding member include solders such as tin-bismuth-based solder, tin-copper-based solder, tin-silver-based solder, gold-tin-based solder and the like; eutectic alloys such as alloys of Au and Sn, Au and Si, Au and Ge, Au and Cu, Ag and Cu as main components; conductive pastes of silver, gold, palladium and the like; bumps; anisotropic conductive materials; brazing materials such as low-melting-point metals; resins such as epoxy, silicon resins and the like. An inorganic material, which is not prone to deterioration by light emission is preferable for bonding of light emitting element emitting ultraviolet radiation. Examples thereof include inorganic material such as solder, alloys, eutectic alloys.

Electronic Component

Electronic component is disposed on the substrate and mounted in a separate region from the region where the light emitting element is mounted (discussed below; hereinafter referred to as a light emission region). The electronic component is preferably disposed in a region outside of the cap discussed below.

In the present specification, the term electronic component means part that contributes to the electrical conduction of the light emitting element, to those related to the drive of the light emitting element, and so forth. Specifically, examples include capacitor, varistor, Zener diode, bridge diode, chip resistor, MELF resistor, and other such protective element, thermistor and other such temperature sensor, temperature compensation element, various kinds of transistor, connector for supplying an external power supply, and other such surface mounted electronic component, as well as cable and the like. These may be used as a single part or as a combination of two or more parts. Using this electronic component provides a high-performance light emitting device with improved reliability in drive and conduction.

Resin Portion

These electronic component has a resin portion on their surface. For example, the resin portion serves as a so-called sealing resin to cover the surface of element, circuit, wiring, terminal, cable, and the like.

There are no particular restrictions on the resin that is the main component of the resin portion, and any resin that is used in this field can be used. An example is a resin that used as a cover member. These can be suitably selected from among thermosetting resins and thermoplastic resins. Of these, epoxy resins offer good mechanical strength and electrical resistance, and as such can be used to advantage in electronic component, but they may have low resistance to light. Accordingly, epoxy resins are particularly suited to the present disclosure.

Also, embodiments of the present disclosure will be particularly effective in the case where the resin portion is black or a dark color that is close to black. Accordingly, the structure of the embodiments can be preferably applied to situations when the resin portion of the electrical component includes carbon black or another such colorant is contained.

Substrate

The substrate is the member on which the light emitting element and the electronic component are mounted. The substrate preferably may have a first main face on which the light emitting element is mounted, and a second main face on the opposite side from this first main face.

There are no particular restrictions on the approximate plan view shape of the substrate (i.e., when viewed from the first main face side of the substrate), and any of various shapes can be used, such as polyhedral, or a polyhedral shape in which one or more of the sides or corners have been rounded. A shape that is approximately quadrangular shape in plan view is preferable, with a rectangular shape being particularly good. In a situation in which the light emitting device is used as a light source for printing or resin curing, and a plurality of light emitting devices are arranged in a row, a rectangular shape is preferable. These shapes may include depression, protruding, cutout, and/or hole or the like, arranged regularly or irregularly.

As long as the substrate is thick enough to be able to support a plurality of light emitting elements, it may be either rigid or flexible. Examples of the material of the substrate include single materials or composite materials of insulating materials such as glass, ceramics, resins, wood, pulp and paper; conductive materials such as semiconductor, metal (e.g., supper, silver, gold, an aluminum). The substrate may have a stacked structure or a single-layer structure of the same or different materials. Among them, metals, ceramics, resins, and the like are preferable. As for ceramics, aluminum nitride is preferable because of its good heat dissipation properties.

The substrate usually has wiring that is electrically connected to the light emitting elements. This wiring may be formed directly on the substrate, or may be formed on a separate base, and the separate base is mounted on the substrate. Since the electronic component is mounted in addition to the light emitting elements on the substrate, wiring connected to the electronic component may be provided. A variety of circuits discussed below can be configured by arranging the wiring.

Any material known in this field can be used for the wiring. For instance, copper, aluminum, gold, silver, or another such metal can be used. The thickness of the wiring can be from a few microns to a few hundred microns, for example. The wiring can be form the wiring by a known method, such as plating or sputtering.

The substrate has on its first main face an emission region where a plurality of light emitting elements are mounted. Different kinds of light emitting element are mounted in this emission region. Just one of each kind of light emitting element may be mounted in the emission region, but a plurality of light emitting elements of each kind may be mounted, for example. That is, one each of the first light emitting element, the second light emitting element, the third light emitting element, and the fourth light emitting element may be mounted in a single light emitting device, or a plurality of each may be mounted. It is preferable for a plurality of light emitting elements to be mounted, with them arranged in a row, a column, or a matrix. With this arrangement, a light emitting device with high output can be obtained.

Different kinds of light emitting elements and electronic component are arranged and mounted in the first direction of the substrate. The first direction of the substrate can be suitably determined, but in the case where the first main face of the substrate is rectangular, for example, the first direction can be the direction that extends along the lengthwise direction of the rectangle.

In an embodiment, when the first light emitting element, the second light emitting element, and an optional n-th light emitting element are disposed on the substrate, the first light emitting element, the second light emitting element, the optional n-th light emitting element, and the electronic component are preferably disposed so as to be arranged in that order in the first direction. In other words, it is preferable either for the first light emitting element, which emits ultraviolet light and whose wavelength is the shortest of three kinds of light emitting element, to be disposed away from the electronic component, or for a light emitting element with which ultraviolet light can be blocked to be disposed between the first light emitting element and the electronic component. This effectively reduces degradation and so forth of the electronic component attributable to irradiation with ultraviolet light.

To this end, it is preferable for the second light emitting element to be a light emitting element that emits light whose wavelength is longer than that of the first light emitting element and whose wavelength is longer than that of ultraviolet light. Alternatively, in the case where the second light emitting element is a light emitting element that emits ultraviolet light but whose wavelength is longer than that of the first light emitting element, the n-th light emitting element that emits light whose wavelength is longer than that of ultraviolet light is preferably disposed in the above-mentioned order.

Regardless of whether the second light emitting element emits ultraviolet light, the first light emitting element, the n-th light emitting element, the second light emitting element, and the electronic component may be disposed so that they are arranged in that order in the first direction.

In another embodiment, as discussed above, in the case where the fourth light emitting element and the third light emitting element are disposed on the substrate, then the third light emitting element, the fourth light emitting element, and the electronic component are preferably disposed so as to be arranged in that order in the first direction. That is, the fourth light emitting element disposed at a position near the electronic component has a narrow light distribution, so most of the light from the fourth light emitting element is emitted upward from the substrate. Also, emission from the third light emitting element, which emits ultraviolet light and has a relatively wide light distribution, can be blocked by the fourth light emitting element. As a result, ultraviolet light emitted from the third light emitting element toward the electronic component can be reduced. This effectively reduces degradation of the electronic component and so forth that would otherwise be caused by irradiation with ultraviolet light.

In this case, the effect of this embodiment will be obtained as long as the third light emitting element emits ultraviolet light, and emits light whose wavelength is either longer or shorter than that of the fourth light emitting element.

Also, the fourth light emitting element preferably includes an element substrate with low light-transmissive property. This allows more of the light emitted from the third light emitting element to be blocked.

In the case where an m-th light emitting element is disposed, its position may be on the opposite side from the third light emitting element and the fourth light emitting element, in between the third light emitting element and the fourth light emitting element, or in between the fourth light emitting element and the electronic component. The wavelength of this element may be either shorter or longer than that of the third light emitting element and/or the fourth light emitting element, it may emit ultraviolet light, or it may emit a light whose wavelength is longer than that of ultraviolet light. Furthermore, the light distribution may be either narrower or broader than that of the third light emitting element. However, in the case where the m-th light emitting element is disposed in between the fourth light emitting element and the electronic component, the m-th light emitting element is preferably has the light distribution which is narrower than that of the third light emitting element, or the wavelength which is longer than that of ultraviolet light.

The light emitting device in this embodiment preferably has segmentation regions where light emitting elements of the same type are mounted in a specific region on the substrate.

A segmentation region is preferably constituted for each type of light emitting element used in the light emitting device. For instance, a plurality of first light emitting elements that emit ultraviolet light can be disposed in a first segmentation region, and a plurality of second light emitting elements of a different kind from the first light emitting element and that emit light whose wavelength is longer than that of the first light emitting elements can be disposed in a second segmentation region.

The wavelength of the light extracted from a segmentation region substantially coincides with the wavelength of the light emitting elements disposed in said segmentation region. Accordingly, with the light emitting device in embodiments, of a plurality of segmentation regions that are segmented by wavelength, the segmentation region in which light emitting elements that emit ultraviolet light are disposed is positioned so as to be away from other segmentation region in which the electronic component is disposed.

In the case where a light emitting device has the region in which the light emitting elements with a short emission wavelength are disposed, at one end of the substrate is incorporated into a device for curing resin or ink, in which the light emitting device is used by being moved with respect to the irradiation target, the target can be irradiated with light of a short wavelength at the start or the end. This may commence promote or curing reaction or various other effects.

Any arrangement of the light emitting elements and the segmentation regions may be used so long as the second light emitting element or the fourth light emitting element is provided in between the first light emitting element or the third light emitting element and the electronic component. This layout allows the order of the type of light emission to be adjusted according to the properties of the irradiation target or the conditions.

The total number of light emitting elements mounted in the light emitting device can be, for example, from one to a few hundred. These light emitting elements can be arranged in from one to a few dozen rows. There are no particular restrictions on connected configuration of the light emitting elements, but examples include configurations with one or more serial, parallel, serial-parallel, or parallel-serial circuits. Of these, it is preferable to include a plurality of serial-parallel or parallel-serial circuits, for example, 2 parallel×10 serial. Connection configurations such as these allow the amount of light to be independently controlled for each circuit. Also, even though one or more light emitting elements may become discontinuous due to breakage or the like, discontinuity can be avoided in the circuits that do not include those light emitting elements. Furthermore, in the case where light emitting elements having the same emission wavelength bands in each circuit, the amount of light of each wavelength can be independently controlled. Furthermore, a single segmentation region may be configured as a single serial circuit or parallel circuit, or a plurality of these segmentation regions may be connected in parallel or series. This makes it possible to independently control the amount of light of the emission wavelength in each segmentation region, and a light emitting device that is compatible with a wide variety of irradiation targets can be obtained.

There are no particular restrictions on the plan view shape of the segmentation regions, but rectangular is preferable.

The layout of the segmentation regions can be suitably set according to the approximate shape of the substrate in plan view. For instance, in the case where the plan shape of surface of the substrate is rectangular, a plurality of segmentation regions can be disposed so that they are arranged along the lengthwise direction, i.e., the first direction. Consequently, in the case where a plurality of light emitting devices which have the same design as the others are arranged so that the sides of the light emitting devices in the lengthwise direction are facing each other in the plan view, the segmentation regions in which the same wavelengths are emitted in the light emitting devices can be aligned.

The surface of the substrate may be covered with a material with high optical reflectivity. The area around the light emitting element may also be covered with a material with high optical reflectivity. This allows the light of the light emitting device to be extracted more efficiently. This material with high optical reflectivity can be suitably selected from among the cover members discussed below, and may be the same material as that of the cover member.

The substrate preferably includes recesses on its side surface. These recesses can be used to house and latch the tabs on the metal frame of the cap discussed below.

The recesses are preferably disposed at positions and in the size and number that allow the cap to be securely fixed. The recesses may be holes disposed on the side surfaces, or may be indentations that open from the side surfaces to the second main face. The recesses are preferably formed as one or two pairs on a pair of side surfaces, or as one or two pairs on two pairs of side surfaces. As long as the recesses are able to latch the tabs, they may have any of various shapes, such as a shape that in plan view is circular, elliptical, polyhedral, or a combination of these.

The light emitting device in an embodiment of the present disclosure may also include other members.

Cover Member

The resin portions of the electronic component are preferably covered by a cover member. The cover member preferably covers the outer surface of the resin portion. The cover member is preferably formed from a material whose resistance to ultraviolet light is higher than that of the resin portion. With this arrangement, degradation of the resin portion by light absorption can effectively be reduced.

The term "light resistance" in the present specification means resistance to a phenomenon whereby there is a change in the surface state such as a change in color, gloss, or dimensions, or cracking, whitening, warping, or the like, a chemical change, or a physical change such as a change in tensile strength, elongation at break, impact strength, modulus of elasticity, or the like from the original resin state. Thus, saying that the light resistance is high means that there will be little change in one or more of these properties. The extent of change in one or more of these areas can be evaluated, before and after a test for resistance to weather or light, by utilizing a commercially available light resistance or weather resistance tester equipped with a light source capable of emitting light that includes ultraviolet light produced by an ultraviolet carbon arc (WV), a sunshine carbon arc (WS), a xenon arc (WX), a metering arc, a remote plasma, or the like, or the acceleration/promotion tester, etc., of these devices.

For example, when a light emitting element with a wavelength of 365 nm is used as the light source of tester, and light is emitted for 200 minutes in a state in which the peak luminosity at a distance (WD) between the light emitting element and the resin which is tested of approximately 10 W/cm$^2$, it can be concluded that the light resistance is low in the case where discoloration or modification is visually noted in the resin, and that the light resistance is high when no discoloration or modification is visually noted in the resin.

A resin, for example, can be used as the base of the cover member. Examples of the resin include a thermosetting resin, a thermoplastic resin, a modified resin and a hybrid resin thereof. Specific Examples of the resin include an epoxy resin composition; a silicone resin composition; a modified epoxy resin composition such as a silicone modified epoxy resin; a modified silicone resin composition such as an epoxy modified silicone resin; a hybrid silicone resin composition such as a sol-gel synthesized resin of silica and silicone; a polyimide resin composition, a modified polyimide resin composition, polyethylene terephthalate resin, polybutylene terephthalate resin, polyethylene terephthalate resin, polyphthalamide (PPA), a polycarbonate resin; a polyphenylene sulfide (PPS); a liquid crystal polymer (LCP); an ABS resin (an acrylonitrile-butadiene-styrene resin); a phenolic resin; an acrylic resin; a PBT resin (polybutylene terephthalate resin), urea resin, BT resin, polyurethane resin and unsaturated polyester resin. Of these, the resin preferably contains a silicone resin, and in the case where the resin portion contains an epoxy resin, it is particularly preferable for the cover member to contain a silicone resin.

In addition to the above-mentioned resin, the cover member also preferably contains an optically light reflective substance, a UV absorbent, and/or a light absorbent. This will improve the light resistance. Examples of the light reflective substances include titanium dioxide, silicon dioxide, zinc dioxide, zirconium dioxide, potassium titanate, alumina, aluminum nitride, magnesium oxide, boron nitride, mullite, niobium oxide, barium sulfate and various types of rare earth oxides such as yttrium oxide, gadolinium oxide, etc.). Examples of the light scattering materials include titanium dioxide, aluminum oxide, silicon oxide and colorants (such as carbon black). The first covering layer may also contain glass fiber, wollastonite, or another such fibrous filler, carbon, talc, silicon oxide, or another such inorganic filler, or other additives. Examples of UV absorbents include any of those normally used in plastics, such as those based on benzotriazole, benzophenone, or salicylate. Examples of light absorbents include UV absorbents and UV blockers. Specific example thereof include titanium oxide, zirconium dioxide, magnesium oxide, titanium dioxide, fibrous filler such as glass, glass fiber, wollastonite and another such fibrous filler, inorganic filler such as aluminum nitride and carbon.

These optically light reflective substances, UV absorbents, and/or light absorbents are preferably contained in an amount of about 10 to 95 wt %, and more preferably about 20 to 80 wt %, with respect to the total weight of the cover member.

The cover member preferably covers the entire surface of the resin portion of an electronic component, but depending on the positional relation between the light emitting element and the electronic component, the form of the cap, and so forth, it may cover just part of the resin portion of the electronic component (such as the upper face, or part of the upper face and the side faces). In particular, in the case where the electronic component is directly or indirectly opposite the light emitting element, it is preferable to cover the entire side face on the side that is opposite.

The cover member may cover wiring, cables, and the like that are formed on or connected to the base or terminals of the electronic component. The surface area that is covered by the cover member can be increased to improve adhesion between the cover member and other members, and to effectively protect the resin portions.

The cover member preferably covers the electronic component so that its upper face is disposed at a position that is lower than the upper face of the cap discussed below. With this arrangement, absorption of the light from the light emitting element by the cover member can be effectively reduced, since the light of the light emitting element is extracted from the cap upper face.

From the standpoint of effectively blocking the light emitted from the light emitting element, the cover member is preferably thicker, but taking into account the need to keep the light emitting device small, a thickness of no more than about 300 μm is preferable, with 200 μm or less being preferred. It is also preferable for the thickness to be at least 50 μm.

In the case where the cover member has a resin as a base, for example, then the cover member can be formed by dispensing, printing, spraying, injection molding, or another such method.

In the case where the cover member has high UV absorbency, it can also be used as a light blocking member that controls the emission of the light emitting element. For instance, in the case where the light emitting device is used as a light source for curing printing ink, in which the ink discharged from a discharge component is cured, the cover member is preferably provided on the side of the light emitting device that is closer to the ink discharge component in order to suppress unnecessary reactions when reflected light irradiates on the ink immediately after discharge or in the discharge component.

Cap

With the light emitting device in this embodiment, a cap is preferably mounted to the substrate on which the light emitting element is mounted, so as to cover the light emitting element. In particular, the cap preferably covers the entire emission regions where the light emitting elements are mounted.

There are no particular restrictions on the outer shape of the cap in plan view, which can be suitably selected as dictated by the shape of the substrate, the layout of the light emitting elements, and so forth. A quadrangle shape in plan view is preferable.

The cap may allow the light emitted from the light emitting elements to be extracted, but preferably has a light transmissive member and a metal frame as its main parts, for example.

Light Transmissive Member

The light transmissive member may constitute at least the upper face of the cap. The light transmissive member may be supported on the metal frame, and may be provided so as to cover the emission region. This means that light emitted from the light emitting elements can be extracted more efficiently. For example, it is preferable when at least 90% of the wavelength of light emitted from the light emitting elements is transmitted.

This member can be formed, for example, from a thermoplastic resin or thermosetting resin, or from glass or the like. Because the light emitting device has the light emitting element emits ultraviolet light, glass is particularly preferable because it is an inorganic substance that resists degradation. In the case where the emission wavelength of any of the light emitting elements mounted in the light emitting device is under 300 nm, quartz glass is preferable.

The shape of the light transmissive member can be suitably determined as dictated by the shape of the metal frame and the region in which the light emitting elements are located, for example. For example, the light-transmissive member is preferably quadrangle or circular in plan view.

The thickness of the light-transmissive member can be suitably selected according to the required thickness, optical characteristics, and so forth of the light emitting device, and is about 0.1 to 10 mm, for example.

The light transmissive member may have convex lens shapes, concave lens shapes, dome shapes, or bumpy shapes are arranged in order to control the light distribution. A plurality of at least one shape may be arranged on a single light-transmissive member to create a fly-eye lens, for example.

With this arrangement, the light distribution from the light emitting elements with the light transmissive member can be controlled, or more specifically, the extraction of light in the upward direction of the light emitting device from the light emitting elements can be increased, and the amount of light emitted by the light emitting elements that irrigates the electronic component can be reduced, which contributes to decreasing degradation of the electronic component.

A dielectric multilayer film, also called an AR coating, for example, that improves the transmission of light from the light emitting elements may be provided to the surface of the light transmissive member. Also, fine irregularities that diffuse light may be provided to the surface of the light transmissive member.

The upper face of the light transmissive member, that is, the upper face of the cap, is preferably located above the upper face of the cover member that covers the electronic component. As discussed above, light emitted from the light emitting element is mainly extracted from the upper face of the light transmissive member. Thus, light from the light emitting elements can be reduced from shining on the electronic component by disposing the upper face of the light transmissive member level with or lower than the upper face of the cover member that covers the electronic component.

Metal Frame

The metal frame is a member that supports the above-mentioned light transmissive member, and constitutes the side faces of the cap, for example. The metal frame is preferably disposed so as to surround the outside of the emission regions. Thus, the metal frame has a part that is disposed so as to face the above-mentioned electronic component. Consequently, the distribution of light from the light emitting elements can be controlled, or more specifically, light directed toward the sides of the light emitting elements can be blocked, which makes it less likely that the light from the light emitting elements will irradiate on the electronic component, and is preferable because this contributes to decreasing degradation of the electronic component.

The metal frame preferably supports the light transmissive member only by the metal frame, that is, by directly clamping, grasping, or otherwise holding it. For example, when an organic substance undergoes degradation, its components may vaporize or scatter, which may contaminate the surface of the light transmissive member. This contamination may decrease the transmissivity of the light transmissive member, that is, it may lead to an increase in optical absorbency, and this would increase the amount of heat generated in the light transmissive member. As a result, this could end up lowering the reliability of the light emitting device. Also, while solder and other such metal-based bonding agents may not degrade as an organic substance, the heat during bonding may cause breakage, distortion, or the like in the light transmissive member.

Meanwhile, in the case where the light transmissive member is supported only by the metal frame, and no adhesive agent (and particularly one of the commonly used agents that contain organic substances) is used, or in other words, in the case where the metal frame is not bonded to the light transmissive member, shedding of the light transmissive member and contamination of the surface of the light transmissive member can be reduced, the light transmissive member can be securely fixed over an extended period, and the reliability of the light emitting device can be improved. In particular, when the light emitting element has short emission wavelength, which may cause the degradation of organic substance are used, this configuration may be particularly preferable. Also, cracking, breakage, and so forth of the light transmissive member caused by distortion attributable to the difference in the coefficients of thermal expansion of the light transmissive member and the metal frame can be reduced.

There are no particular restrictions on the material of the metal frame as long as it is a metal, but examples include copper, iron, nickel, chromium, aluminum, silver, gold, titanium, and alloys of these. The surface may also have a light reflecting material or light absorbing material formed by plating, coating, or the like. This can reduce the absorption of light, increase the light extraction efficiency of the light emitting device, or suppresses heat generation in the metal frame. In order to reduce unintended electrical conduction with the light emitting elements, the surface of the metal frame is preferably insulated by covering it with insulating substance such as $SiO_2$, or by performing an insulating treatment or the like. This allows the distance between the metal frame and the light emitting elements to be reduced, and affords greater latitude in the layout of the light emitting elements.

There are no particular restrictions on the shape of the metal frame, which can be suitably selected according to the shape, etc., of the light transmissive member and substrate. It is particularly preferable for the metal frame to be quadrangle in plan view. The metal frame is preferably includes side tabs and top tabs in order to clamp or otherwise hold the light transmissive member.

A hook structure or the like can be provided to the side tabs (discussed below), etc., and these can be utilized to fix the metal frame, for example.

Side Piece

The side piece is a portion that extends toward the substrate from above the first main face of the substrate in the metal frame. That is, the side piece extends toward the substrate from above the first main face of the substrate so as to cover the light emitting elements. For example, there is a pair of first side pieces and a pair of second side pieces corresponding to the side surfaces of the substrate discussed above.

The first side pieces preferably extend from above the first main face of the substrate to the side surfaces of the substrate and extend along the side surfaces of the substrate, so as to cover the side surfaces of the substrate. The second side pieces preferably extend toward the substrate from above the first main face of the substrate, and are disposed with their ends in contact on the first main face of the substrate. This configuration can reduce the metal frame from shifting, etc., in the up and down direction of the metal frame, and allows the light-transmissive member to be fixed at the specified position with respect to the substrate.

The height f of the first side pieces is preferably greater than the height g of the second side pieces. This allows the side surfaces of the substrate to be clamped by the first side pieces, and at the same time allows the second side pieces to be disposed on the first main face of the substrate. As a result, the light-transmissive member can be fixed more securely, and the light emitting device can be made more compact. Furthermore, disposing the second side pieces on the substrate allows the distance from the emission surface of the light emitting element to the bottom surface or the light incident surface of the transmissive material to be kept constant, making it possible to stabilize characteristics of the optical output.

The height f of the first side pieces may be slightly less than, equal to, or slightly greater than the total of the thickness of the substrate, the thickness of the light-transmissive member, and the height of the space required for the light emitting region. The term "equal" in the present specification encompasses a range that will not affect the characteristics, manufacture, and so on of the light emitting device. For example, fluctuation of about a few dozen microns to a few hundred microns is permissible.

Such metal frame can be manufactured by forming a sheet metal frame by bending or otherwise working it with a wire cutter, a servo brake press, or another such known method. Also, the metal frame can be formed by cutting, deforming, or bending a flat piece of metal by a method known in this field. The thickness of the metal sheet is from about a few hundredths of a millimeter to 1 mm.

Top Piece

The top piece is a part of the metal frame, and is disposed over the light transmissive member. The top piece is preferably disposed so as to cover only part of the outer periphery of the light transmissive member. It is particularly preferable in the case where the top piece is contiguous (adjacent) to the second side piece, and is connected to the first side pieces only at the width of the top piece. This allows the light transmissive member to be held with very small cover margin of the light transmissive member at the locations along the first side pieces. As a result, a light emitting device that is more compact and has a larger opening area can be obtained.

An embodiment of the light emitting device pertaining to the present disclosure will be described through reference to the drawings.

Embodiment 1

Figure 1B:
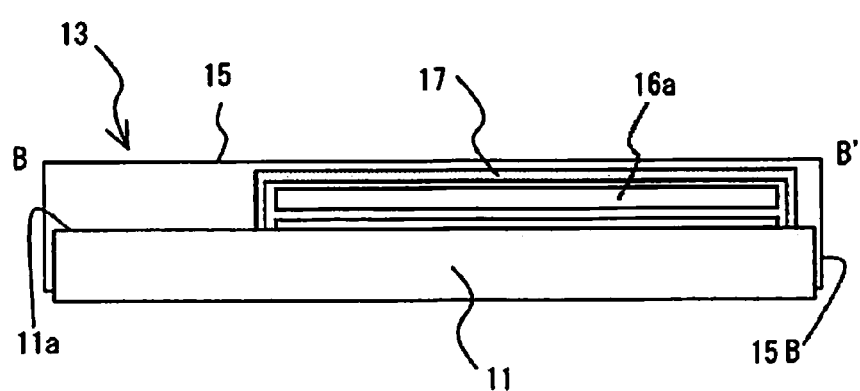
FIG. 1B is a schematic cross sectional view along the B-B' line in FIG. 1A.

As shown in FIGS. 1A and 1B, the light emitting device 10 in this embodiment comprises a substrate 11, a first type of light emitting element 12C1, a second type of light emitting element 12E2, and a third type of light emitting element 12F3 that are all mounted on the substrate 11, a cap 13 that covers the light emitting elements 12C1, 12E2, and 12F3, and electronic components 16a and 16b. The electronic component 16a is a connector, and the electronic component 16b is a Zener diode.

Substrate 11

The substrate 11 is a flat member that has a first main face 11a and whose main material is aluminum nitride. The first main face 11a of the substrate 11 has a planar rectangular shape and the thickness of the substrate is 2 mm. A white, insulating resist is provided over the first main face of the substrate 11 to reflect light from the light emitting elements.

The substrate 11 has wiring for connecting the light emitting elements 12C1, 12E2, and 12F3 on the first main face 11a. With this circuit pattern, three segmentation regions 11C1, 11E2, and 11F3 where the light emitting elements 12C1, 12E2, and 12F3 respectively are mounted are provided.

The segmentation regions 11C1, 11E2, and 11F3 of the substrate 11 are arranged in that order in the lengthwise direction of the surface of the substrate 11. The electronic components 16a and 16b have regions disposed on the opposite side of the segmentation region 11F3 from the segmentation region 11E2.

Light Emitting Elements 12C1, 12E2, and 12F3

The light emitting elements have, for example, a semiconductor layer including a nitride semiconductor. The emission peak wavelength of the light emitting elements 12C1 is 365 nm, the emission peak wavelength of the light emitting elements 12E2 is 385 nm, and the emission peak wavelength of the light emitting elements 12F3 is 405 nm. The shape of each light emitting element is substantially quadrangle in plan view. There are 24 of the light emitting elements 12C1, arranged in six columns and four rows in the segmentation region 11C1 on the substrate 11. There are 18 of the light emitting elements 12E2, arranged in six columns and three rows in the segmentation region 11E2 on the substrate 11. There are 18 of the light emitting elements 12F3, arranged in six columns and three rows in the segmentation region 11F3 on the substrate 11.

Cap 13

The cap 13 is fixed to the substrate so as to cover all of the light emitting elements 12C1, 12E2, and 12F3 in the segmentation regions 11C1, 11E2, and 11F3 on the substrate where the light emitting elements 12C1, 12E2, and 12F3 are mounted on the first main face. The approximate planar shape of the cap 13 is quadrangle.

The cap 13 has a light transmissive member 14 and a metal frame 15. The cap 13 has hook structures on the metal frame 15 in order to fix it to the substrate 11.

Light Transmissive Member 14

The light transmissive member 14 is made of glass, and is quadrangle in plan view. Its size is 24.6×27.1 mm, and it is 0.7 mm thick.

Metal Frame 15

The metal frame 15 supports the light-transmissive member 14. The metal frame 15 clamps the light-transmissive member 14 by direct contact with the light-transmissive member 14, and no bonding agent is used between it and the light-transmissive member 14.

The metal frame 15 is made of a sheet of aluminum, and is quadrangle in plan view.

The metal frame 15 has side pieces that extend toward the substrate from above the first main face of the substrate. The side pieces include first side pieces 15B that extend in the lengthwise direction of the substrate 11, and second side pieces 15D that extend in the short-side direction of the substrate 11.

The metal frame 15 further has a top piece 15A.

Electronic Components 16

The connector, Zener diode, or other such electronic components 16a and 16b are mounted outside the cap 13 and at the end of the first main face 11a of the substrate 11. These electronic components 16a and 16b are disposed so as to face to a second side tab 15D of the metal frame 15 of the cap 13.

The electronic components 16a and 16b have resin portions on their surfaces. The resin portions are made of an epoxy resin that contains carbon black. As shown in FIG. 1B, the surfaces of the resin portions of the electronic components 16a and 16b are each covered by a cover member 17. The cover members 17 are made of a silicone resin that contains 30 wt % titanium oxide as a light reflecting substance. The thickness of the cover members 17 is about 300 μm.

The surfaces of the electronic components 16a and 16b are bumpy and stepped, so the material that constitutes the cover members 17 is preferably applied to the surfaces of the electronic components 16a and 16b by a dispenser.

The upper faces of the electronic components 16a and 16b are disposed lower than the upper face of the cap 13.

With the light emitting device 10 in this embodiment, the first type of light emitting elements 12C1 and the second type of light emitting elements 12E2 that emit ultraviolet light are disposed in that order starting from the side farthest away from the electronic components 16a and 16b. The third type of light emitting elements 12F3, which emit light whose wavelength is longer than those of the first type of light emitting elements 12C1 and the second type of light emitting elements 12E2, are disposed between the electronic components 16a and 16b and the second type of light emitting elements 12E2 which emit ultraviolet light. Therefore, the ultraviolet light that is emitted from the first type of light emitting elements 12C1 and the second type 12E2 of light emitting elements 12C1 and reaches the electronic components 16a and 16b can be effectively blocked by the third type of light emitting elements 12F3, so degradation of the electronic components can be suppressed.

Also, with the light emitting device in this embodiment, the light emitting elements with the shortest emission wavelength are disposed at the end of the substrate 11. This allows curing of the resin to be carried out more efficiently when the light emitting device is used as a light source for curing resins and the like.

Also, since the surfaces of the electronic components 16a and 16b, and specifically the surfaces where the resin portions are formed, are covered by the light-reflecting cover members 17, even though some of the ultraviolet light emitted from the light emitting elements shines on the electronic components 16a and 16b, degradation or decomposition of the electronic components can be suppressed, and the electronic components 16a and 16b can be effectively protected. Accordingly, separation and contamination caused by decomposition products and the like can be reduced, and a light emitting device that is highly reliable over the long term can be obtained.

Embodiment 2

Figure 2A:
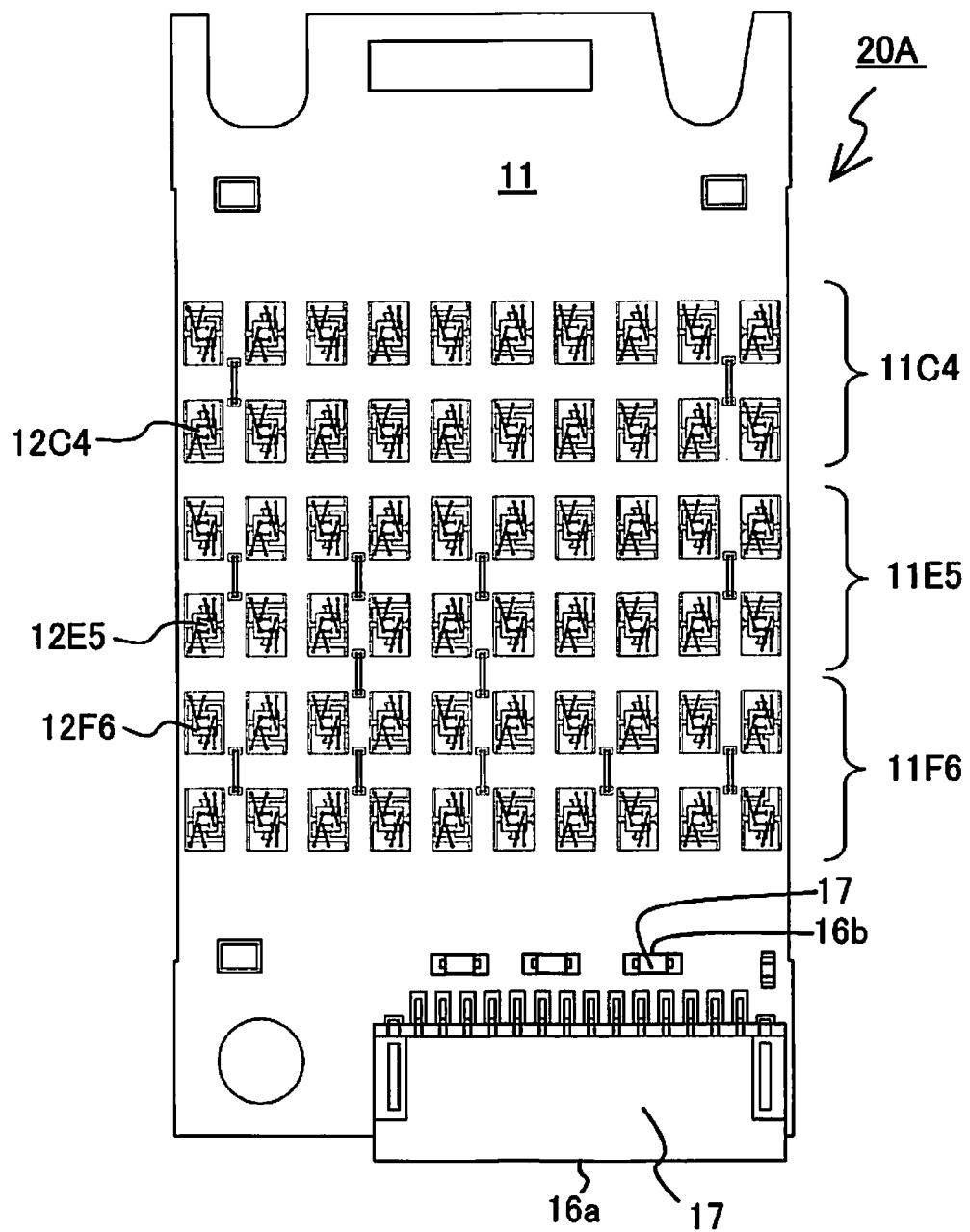
FIG. 2A is a schematic plan view of another embodiment of the light emitting device disclosed herein.

As shown in FIG. 2A, the light emitting device 20A in this embodiment is such that the first main face 11a of the substrate 11 has three segmentation regions 11C4, 11E5, and 11F6 in which are mounted a fourth type of light emitting elements 12C4, a fifth type of light emitting elements 12E5, and a sixth type of light emitting elements 12F6 respectively. The segmentation regions 11C4, 11E5, and 11F6 are arranged in that order in the lengthwise direction of the first main surface of the substrate 11, and the substrate 11 has a region in which the electronic components 16a and 16b are disposed on the opposite side of the segmentation region 11F6 from the segmentation region 11E5.

The light emitting elements include the fourth type of light emitting elements 12C4 with an emission peak wavelength of 385 nm, the fifth type of light emitting elements 12E5 with an emission peak wavelength of 395 nm, and the sixth type of light emitting elements 12F6 with an emission peak wavelength of 405 nm, each of which has a semiconductor layer including a nitride semiconductor, for example. 20 of the fourth type of light emitting elements 12C4 are arranged in 10 columns and 2 rows in the segmentation region 11C4 on the substrate 11. 20 of the fifth type of light emitting elements 12E5 are arranged in 10 columns and 2 rows in the segmentation region 11E5 on the substrate 11. 20 of the sixth type of light emitting elements 12F6 are arranged in 10 columns and 2 rows in the segmentation region 11F6 on the substrate 11.

In FIG. 2A to 5, for the sake of illustration, a plan view of the light emitting device is shown in a state without the cap.

Other than the above configuration, the light emitting device 20A in this embodiment has similar configuration as the light emitting device 10 to Embodiment 1, and substantially the same effect as the light emitting device 10.

Modification Example of Embodiment 2

Figure 2B:
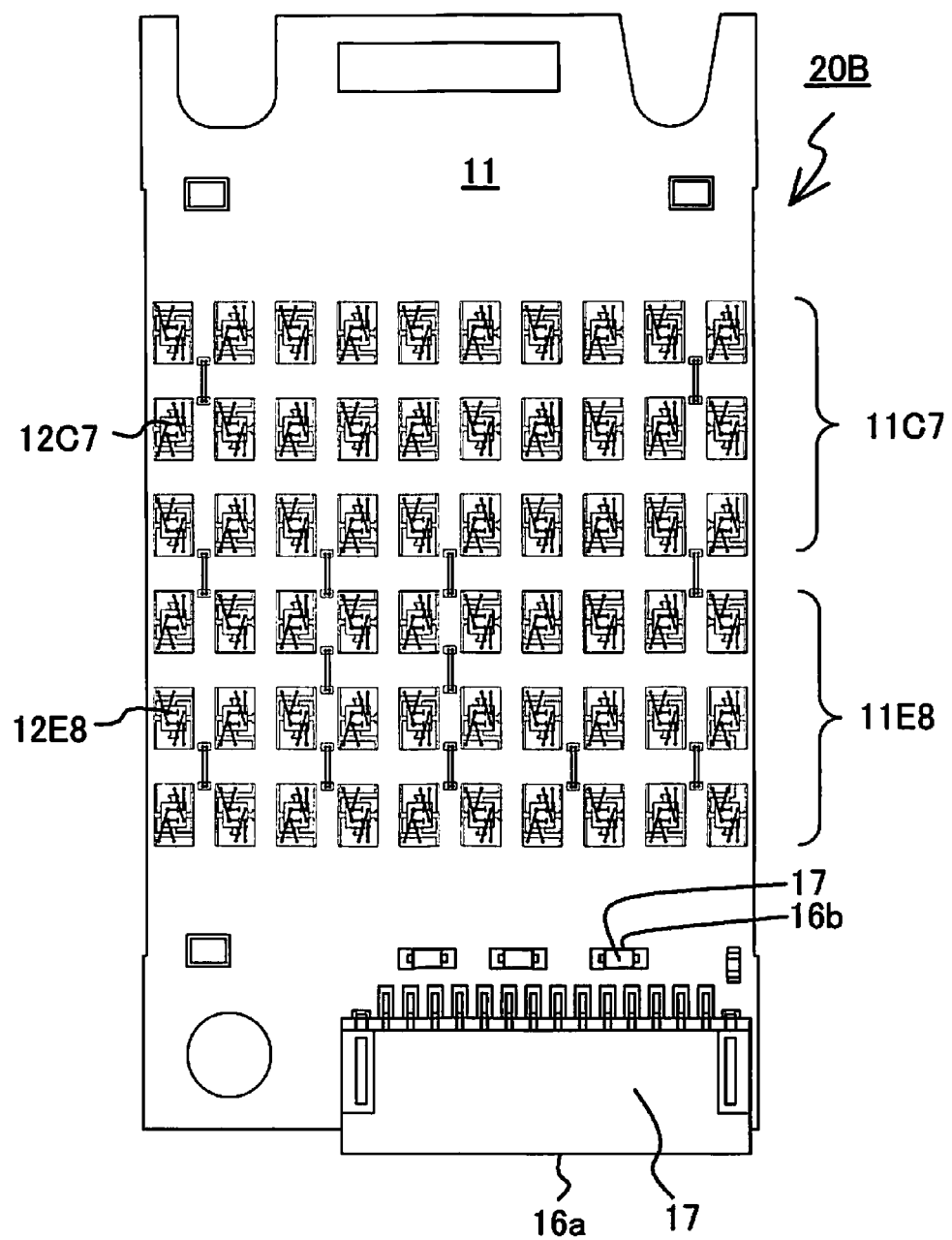
FIG. 2B is a schematic plan view of still another embodiment of the light emitting device disclosed herein.

As shown in FIG. 2B, the light emitting device 20B in this embodiment is such that the first main face 11a of the substrate 11 has two segmentation regions 11C7 and 11E8 in which are mounted a seventh type of light emitting elements 12C7 and an eighth type 12E8 respectively. The segmentation regions 11C7 and 11e are arranged in that order in the lengthwise direction of the first main face of the substrate 11, and the substrate 11 further has a region in which the electronic components 16a and 16b are disposed, on the opposite side of the segmentation region 11E8 from the segmentation region 11C7.

The light emitting elements include, the seventh type of light emitting elements 12C7 with an emission peak wavelength of 385 nm, and the eighth type of light emitting elements 12E8 with an emission peak wavelength of 405 nm, comprising a semiconductor layer including a nitride semiconductor, for example. 30 of the seventh type of light emitting elements 12C7 are arranged in 10 columns and 3 rows in the segmentation region 11C7 on the substrate 11. 30 of the eighth type of light emitting elements 12E8 are arranged in 10 columns and 3 rows in the segmentation region 11E8 on the substrate 11.

Other than the above configuration, the light emitting device 20A in this embodiment has similar configuration to the light emitting device 10 in Embodiment 1, and substantially the same effect as the light emitting device 10.

Embodiment 3

Figure 3:
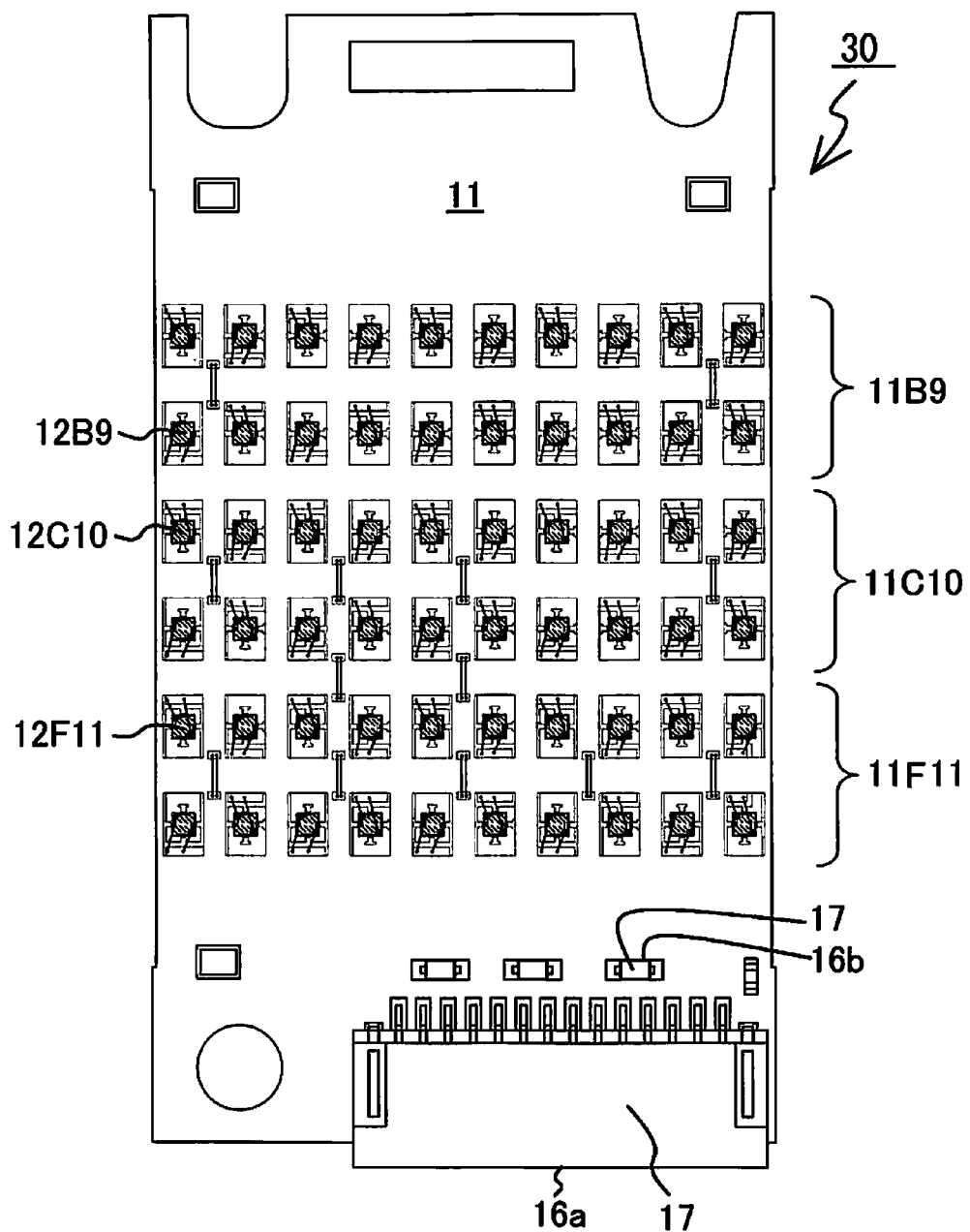
FIG. 3 is a schematic plan view of still another embodiment of the light emitting device disclosed herein.

As shown in FIG. 3, the light emitting device 30 in this embodiment is such that the first main face 11a of the substrate 11 has three segmentation regions 11B9, 11C10, and 11F11 in which are mounted a ninth type of light emitting elements 12B9, a tenth type of light emitting elements 12C10, and an eleventh type of light emitting elements 12E11 respectively. The segmentation regions 11B9, 11C10, and 11F11 are arranged in that order in the lengthwise direction of the first main face of the substrate 11, and the substrate 11 further has a region in which the electronic components 16a and 16b are disposed, on the opposite side of the segmentation region 11C10 from the segmentation region 11B9.

The light emitting elements include, the ninth type of light emitting elements 12B9 with an emission peak wavelength of 310 nm, the tenth type of light emitting elements 12C10 with an emission peak wavelength of 365 nm, and the eleventh type of light emitting elements 12F11 with an emission peak wavelength of 405 nm, each of which has a nitride semiconductor as its semiconductor layer, for example. The ninth type of light emitting elements 12B9 are arranged in 10 columns and 2 rows in the segmentation region 11B9 on the substrate 11. The tenth type of light emitting elements 12C10 are arranged in 10 columns and 2 rows in the segmentation region 11C10 on the substrate 11. The eleventh type of light emitting elements 12F11 are arranged in 10 columns and 2 rows in the segmentation region 11F11 on the substrate 11.

Other than the above configuration, the light emitting device 30 in this embodiment has similar configuration to the light emitting device 10 in Embodiment 1, and substantially the same effect as the light emitting device 10.

Embodiment 4

Figure 4:
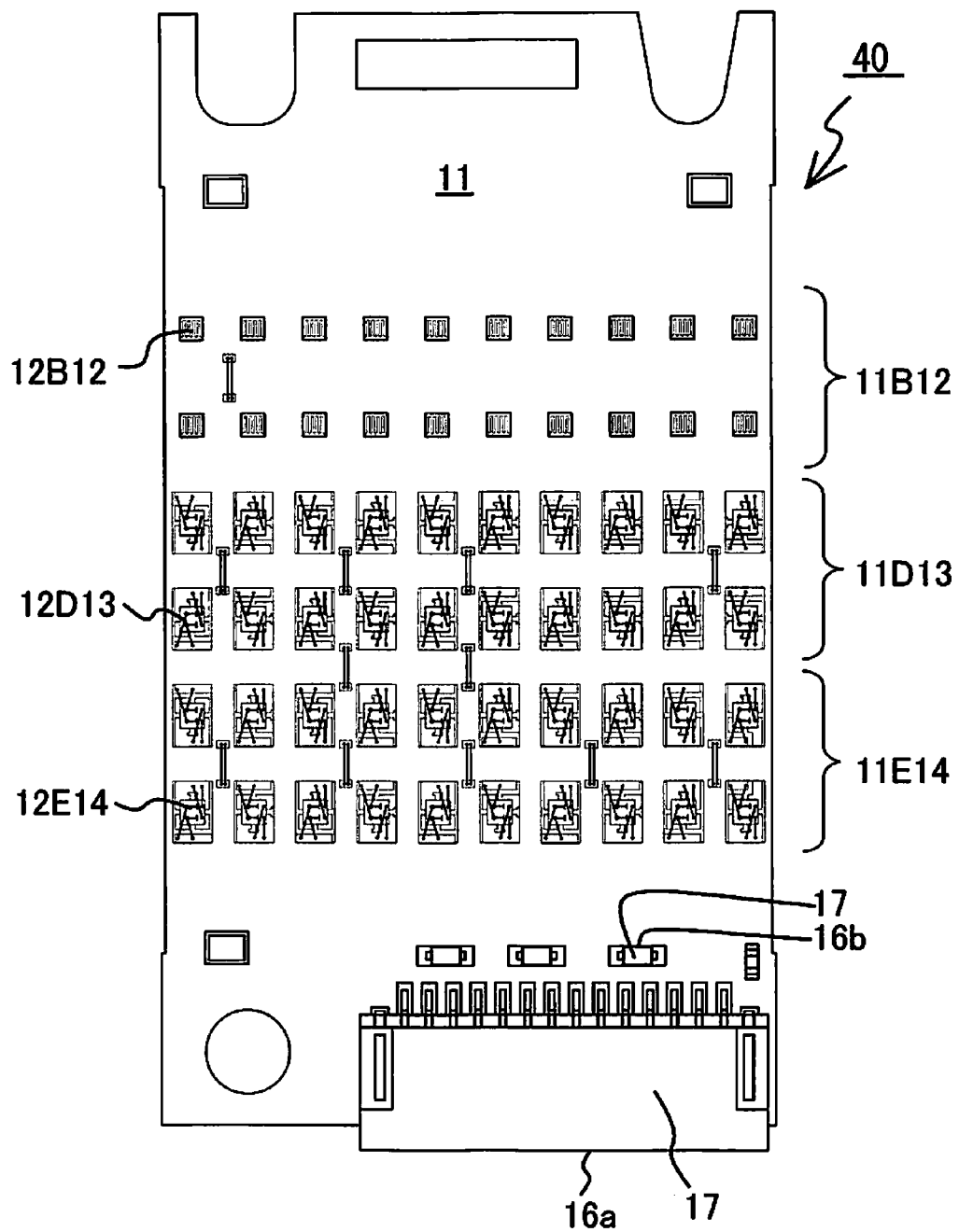
FIG. 4 is a schematic plan view of still another embodiment of the light emitting device disclosed herein.

As shown in FIG. 4, the light emitting device 40 in this embodiment is such that the first main face 11a of the substrate 11 has three segmentation regions 11B12, 11D13, and 11E14 in which are mounted a twelfth type of light emitting elements 12B12, a thirteenth type of light emitting elements 12D13, and a fourteenth type of light emitting elements 12E14 respectively. The segmentation regions 11B12, 11D13, and 11E14 are arranged in that order in the lengthwise direction of the first main face of the substrate 11, and the substrate 11 further has a region in which the electronic components 16a and 16b are disposed, on the opposite side of the segmentation region 11E14 from the segmentation region 11D13.

The light emitting elements include the twelfth type of light emitting elements 12B12 with an emission peak wavelength of 310 nm, the thirteenth type of light emitting elements 12D13 with an emission peak wavelength of 385 nm, and the fourteenth type of light emitting elements 12E14 with an emission peak wavelength of 405 nm, each of which has a nitride semiconductor as its semiconductor layer, for example. The twelfth type of light emitting elements 12B12 are arranged in 10 columns and 2 rows in the segmentation region 11B12 on the substrate 11, by flip-chip mounting. The thirteenth type of light emitting elements 12D13 are arranged in 10 columns and 2 rows in the segmentation region 11D13 on the substrate 11. The thirteenth type of light emitting elements 12E14 are arranged in 10 columns and 2 rows in the segmentation region 11E14 on the substrate 11.

The twelfth type of light emitting elements 12B12 have a light transmissive substrate on the light extraction side of the light emitting device, and have a semiconductor layer and a pair of positive and negative electrodes on the side facing to the substrate 11.

The thirteenth type of light emitting elements 12D13 and the fourteenth type of light emitting elements 12E14 all have a laminar structure comprising a conductive element substrate which serves as the p-side electrode, a reflective film which also functions as a p-side full-face electrode, a p-type semiconductor layer, an active layer, an n-type semiconductor layer, and an n-side electrode, in that order from the bottom side of the light emitting elements. The light emitting elements 12D13 and 12E14 thus configured are such that light from the active layer mainly radiates out in the direction of the n-type semiconductor layer or in the direction of the p-type semiconductor layer, and light that comes out in the direction of the n-type semiconductor layer is mainly extracted substantially straight up. Meanwhile, light that comes out in the direction of the p-type semiconductor layer is mainly reflected by the reflective film provided over substantially the entire region between the conductive element substrate and the p-type semiconductor layer, and so is reflected to and extracted on the semiconductor layer side. Because of this light extraction, the light is stronger straight up from the light emitting element, and the light emitting element has a narrower light distribution.

Other than the above configuration, the light emitting device 40 in this embodiment has similar configuration to the light emitting device 10 in Embodiment 1, and substantially the same effect as the light emitting device 10.

Embodiment 5

Figure 5:
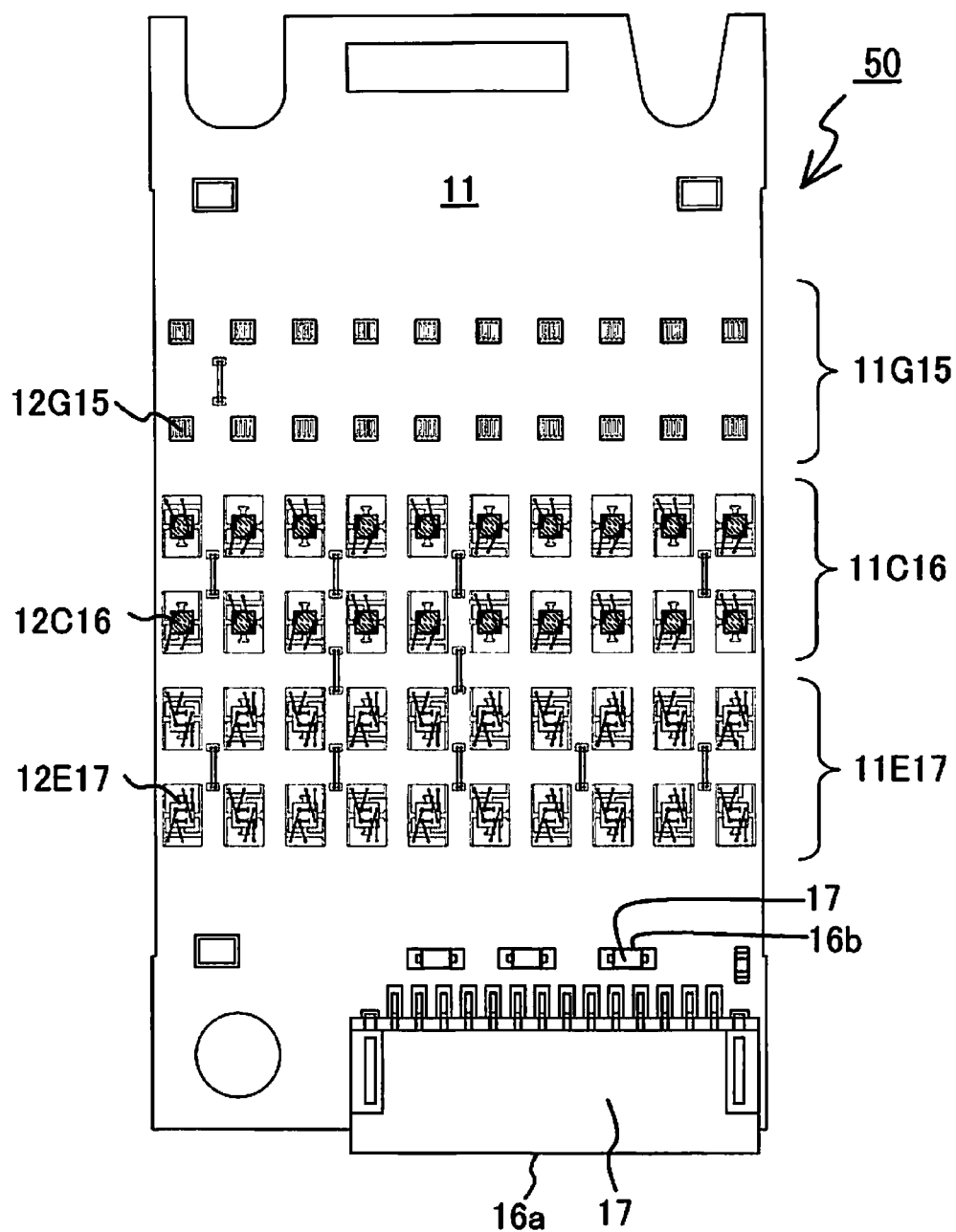
FIG. 5 is a schematic plan view of still another embodiment of the light emitting device disclosed herein.

As shown in FIG. 5, the light emitting device 50 in this embodiment is such that the first main face 11a of the substrate 11 has three segmentation regions 11G15, 11C16, and 11E17 in which are mounted a fifteenth type of light emitting elements 12G15, a sixteenth type of light emitting elements 12C16, and a seventeenth type of light emitting elements 12E17 respectively. The segmentation regions 11G15, 11C16, and 11E17 are arranged in that order in the lengthwise direction of the first main face of the substrate, and the substrate 11 further has a region in which the electronic components 16a and 16b are disposed, on the opposite side of the segmentation region 11E17 from the segmentation region 11C16.

The light emitting elements include the fifteenth type of light emitting elements 12G15 with an emission peak wavelength of 255 nm, the sixteenth type of light emitting elements 12C16 with an emission peak wavelength of 365 nm, and the seventeenth type of light emitting elements 12E17 with an emission peak wavelength of 395 nm, each of which has a nitride semiconductor as its semiconductor layer, for example. The fifteenth type of light emitting elements 12G15 are arranged in 10 columns and 2 rows in the segmentation region 11G15 on the substrate 11, by flip-chip mounting. The sixteenth type of light emitting elements 12C16 are arranged in 10 columns and 2 rows in the segmentation region 11C16 on the substrate 11. The seventeenth type of light emitting elements 12E17 are arranged in 10 columns and 2 rows in the segmentation region 11E17 on the substrate 11.

The fifteenth type of light emitting elements 12G15 have a light transmissive substrate on the light extraction side of the light emitting device, and have a semiconductor layer and a pair of positive and negative electrodes on the side facing to the substrate 11.

The sixteenth type of light emitting elements 12C16 have a laminar structure comprising a conductive element substrate which serves as the p-side electrode, a reflective film (which also functions as a p-side full-face electrode), a p-type semiconductor layer, an active layer, an n-type semiconductor layer, and an n-side electrode, in that order from the bottom side of the light emitting element. The light emitting elements 12C16 thus configured are such that light from the active layer radiates out in the direction of the n-type semiconductor layer or in the direction of the p-type semiconductor layer, and light that comes out in the direction of the n-type semiconductor layer is mainly extracted substantially straight up. Meanwhile, light that comes out in the direction of the p-type semiconductor layer is reflected by the reflective film provided over substantially the entire region between the conductive element substrate and the p-type semiconductor layer, and so is mainly reflected to the semiconductor layer side. Consequently, the light outputted straight up from the light emitting element is stronger, and the light distribution is narrower.

The seventeenth type of light emitting elements 12E17 have a semiconductor layer and a pair of positive and negative electrodes on the light extraction side of the light emitting device, and have a light transmissive substrate on the side opposite the substrate 11.

Other than the above configuration, the light emitting device 50 in this embodiment has similar configuration to the light emitting device 10 in Embodiment 1, and substantially the same effect as the light emitting device 10.

Embodiment 6

Figure 6:
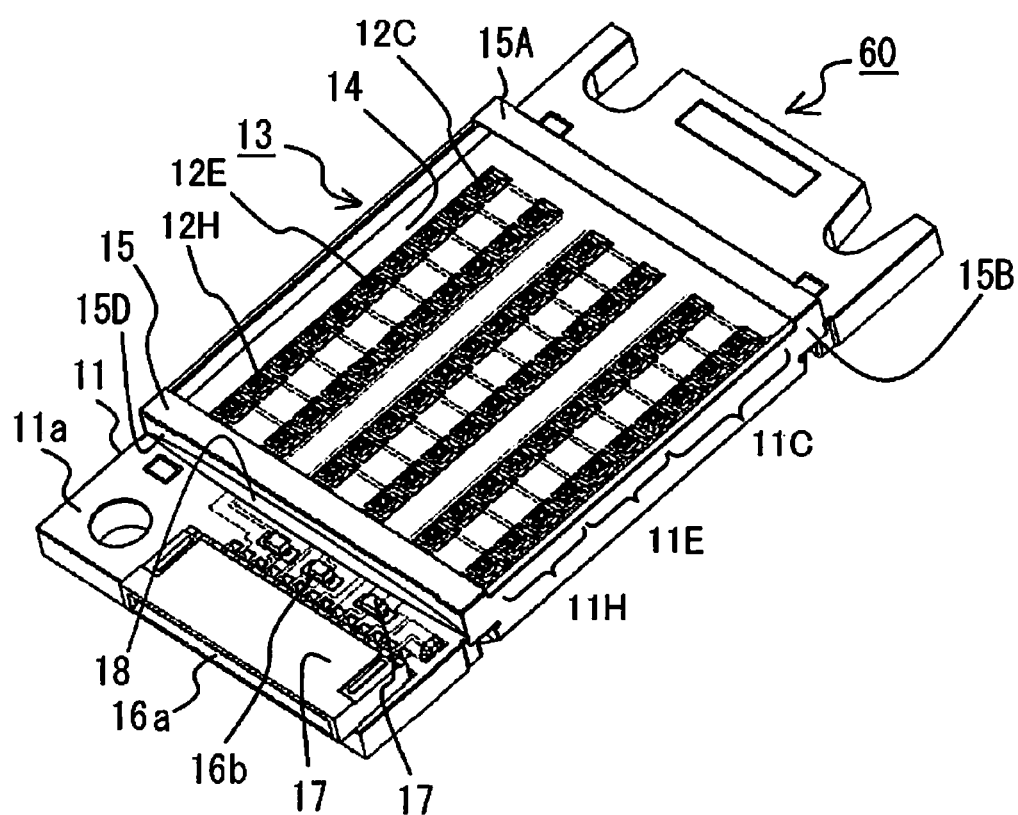
FIG. 6 is a schematic oblique view of another embodiment of the light emitting device disclosed herein.

As shown in FIG. 6, the light emitting device 60 in this embodiment is such that a cover member 18 is disposed in order to effectively block the tiny gap between the second side tab 15D of the cap 13 that covers the light emitting elements 12C, 12E, and 12H, and the first main face 11a of the substrate 11 on which the end of this tab is disposed.

Other than the above configuration, the configuration is similar the same to that of the light emitting device 10 in Embodiment 1. Thus, the effect is substantially the same as that of the light emitting device 10.

Thus providing the cover member 18 more reliably reduces the ultraviolet light emitted from the light emitting elements 12 from leaking to the electronic components 16a and 16b.

The light emitting device according to the present disclosure can be used for various kinds of light sources, such as light sources for printing ink curing, resin curing and exposure apparatus for a light source, projectors, illumination light sources, light sources for various kinds of indicators, light sources for automobile use, light sources for displays, back light sources for liquid crystal displays, light sources for sensors, signals, automobile use, channel control characters for channel boards.

What is claimed is:
1. A light emitting device comprising:
at least one first light emitting element configured to emit ultraviolet light;
at least one second light emitting element configured to emit light having a wavelength longer than that of the ultraviolet light emitted from the at least one first light emitting element;
an electronic component including a resin portion on a surface thereof;
a substrate on which the at least one first light emitting element, the at least one second light emitting element, and the electronic component are mounted and disposed in that order along a first direction of the substrate; and
a cap mounted to the substrate and covering the at least one first light emitting element and the at least one second light emitting element, the cap having a metal frame constituting side faces of the cap and disposed between the at least one second light emitting element and the electronic component.
2. The light emitting device according to claim 1, wherein the at least one first light emitting element includes a plurality of first light emitting elements, and
the at least one second light emitting element includes a plurality of second light emitting elements.
3. The light emitting device according to claim 2, wherein the first light emitting elements and the second light emitting elements are disposed in rows.
4. The light emitting device according to claim 1, further comprising
a cover member covering the electronic component.
5. The light emitting device according to claim 1, wherein the resin portion includes an epoxy resin as a main component.
6. A light emitting device comprising:
at least one first light emitting element configured to emit ultraviolet light;
at least one second light emitting element whose luminous intensity distribution is narrower than that of the at least one first light emitting element;
an electronic component including a resin portion on a surface thereof;
a substrate on which the at least one first light emitting element, the at least one second light emitting element, and the electronic component are mounted and disposed in that order along a first direction of the substrate; and
a cap mounted to the substrate and covering the at least one first light emitting element and the at least one second light emitting element, with the electronic component being disposed outside of the cap.
7. The light emitting device according to claim 6, wherein the at least one first light emitting element includes a semiconductor layer and a light transmissive substrate, and the at least one second light emitting element includes a substrate whose light transmissive property is lower than that of the light transmissive substrate.

* * * * *

UNITED STATES PATENT AND TRADEMARK OFFICE
CERTIFICATE OF CORRECTION

PATENT NO. : 9,748,215 B2
APPLICATION NO. : 14/974387
DATED : August 29, 2017
INVENTOR(S) : Takahiro Oyu et al.

It is certified that error appears in the above-identified patent and that said Letters Patent is hereby corrected as shown below:

On the Title Page

Please change the listing of item [72] from:
[72] Inventors: Takahiro Oyu, Tokyo (JP); Masato Ono, Sagamihara (JP)
To:
-- [72] Inventors: Takahiro Oyu, Chiyoda-ku (JP); Masato Ono, Sagamihara (JP) --

Signed and Sealed this
Twenty-seventh Day of February, 2018

Andrei Iancu
*Director of the United States Patent and Trademark Office*